United States Patent
Dannar et al.

(10) Patent No.: US 12,353,180 B2
(45) Date of Patent: Jul. 8, 2025

(54) BATTERY COMMUNICATION AND CONTROL SYSTEMS AND METHODS

(71) Applicant: DD Dannar, LLC, Muncie, IN (US)

(72) Inventors: Gary Don Dannar, Muncie, IN (US); Stephen T Hung, Auburn, AL (US)

(73) Assignee: DD Dannar, LLC, Muncie, IN (US)

( * ) Notice: Subject to any disclaimer, the term of this patent is extended or adjusted under 35 U.S.C. 154(b) by 458 days.

(21) Appl. No.: 17/621,934

(22) PCT Filed: Jun. 23, 2020

(86) PCT No.: PCT/US2020/039120
§ 371 (c)(1),
(2) Date: Dec. 22, 2021

(87) PCT Pub. No.: WO2020/263816
PCT Pub. Date: Dec. 30, 2020

(65) Prior Publication Data
US 2022/0244691 A1    Aug. 4, 2022

Related U.S. Application Data

(60) Provisional application No. 62/865,672, filed on Jun. 24, 2019.

(51) Int. Cl.
*G05B 19/042*    (2006.01)
*G01R 31/367*    (2019.01)
(Continued)

(52) U.S. Cl.
CPC ......... *G05B 19/042* (2013.01); *G01R 31/367* (2019.01); *H01M 10/425* (2013.01);
(Continued)

(58) Field of Classification Search
None
See application file for complete search history.

(56) References Cited

U.S. PATENT DOCUMENTS

| | | | | |
|---|---|---|---|---|
| 4,876,513 A | * | 10/1989 | Brilmyer | G01R 31/3842 340/636.11 |
| 4,952,862 A | * | 8/1990 | Biagetti | G01R 31/3835 320/132 |

(Continued)

FOREIGN PATENT DOCUMENTS

| | | |
|---|---|---|
| DE | 102012211125 A1 | 1/2014 |
| EP | 1329013 A2 | 7/2003 |

(Continued)

OTHER PUBLICATIONS

Canadian Office Action dated Jan. 27, 2023 in counterpart Canadian Patent Appln. No. 3,144,399.

(Continued)

*Primary Examiner* — Jason Lin
(74) *Attorney, Agent, or Firm* — Fox Rothschild LLP (57) ABSTRACT

Systems and methods for use with a battery having an electronic system connected to a battery network configured to generate a state variable associated with the receiving, storing and/or outputting of electricity by the battery. The system includes a router connected to the battery network and the electronic system for monitoring the at least one detectable state variable, and based on such monitoring, selectively modifying the receiving, storing and/or outputting of electricity by the battery. The system also may include a second network and a controller connected to the second network and to the router via the battery network and configured to monitor the router, and based on the monitoring of the at least one router, selectively modify the router and the receiving, storing and/or outputting of electricity by the battery.

27 Claims, 3 Drawing Sheets

(51) Int. Cl.
*H01M 10/42* (2006.01)
*H01M 10/48* (2006.01)
*H04L 67/12* (2022.01)

(52) U.S. Cl.
CPC .......... *H01M 10/482* (2013.01); *H04L 67/12* (2013.01); *G05B 2219/2639* (2013.01); *H01M 2010/4271* (2013.01); *H01M 2010/4278* (2013.01)

(56) References Cited

U.S. PATENT DOCUMENTS

| | | | | |
|---|---|---|---|---|
| 5,130,659 | A * | 7/1992 | Sloan | G01R 31/3835 |
| | | | | 324/426 |
| 5,371,682 | A * | 12/1994 | Levine | G01R 31/3842 |
| | | | | 324/426 |
| 5,587,660 | A * | 12/1996 | Chabbert | G01R 31/367 |
| | | | | 324/426 |
| 5,663,626 | A * | 9/1997 | D'Angelo | H02P 23/0004 |
| | | | | 318/811 |
| 5,773,962 | A * | 6/1998 | Nor | B60L 58/13 |
| | | | | 320/122 |
| 5,822,495 | A * | 10/1998 | Wang | G06N 3/065 |
| | | | | 706/5 |
| 6,064,180 | A * | 5/2000 | Sullivan | B60L 58/10 |
| | | | | 320/132 |
| 6,081,096 | A * | 6/2000 | Barkat | H02J 9/061 |
| | | | | 320/124 |
| 6,104,967 | A * | 8/2000 | Hagen | H02J 7/0047 |
| | | | | 429/61 |
| 6,255,801 | B1 * | 7/2001 | Chalasani | G01R 31/392 |
| | | | | 320/132 |
| 6,311,279 | B1 * | 10/2001 | Nguyen | H02J 7/02 |
| | | | | 713/300 |
| 8,770,477 | B2 | 7/2014 | Hefetz | |
| 8,904,049 | B2 * | 12/2014 | McCormick | G06F 13/4282 |
| | | | | 429/61 |
| 9,184,618 | B2 | 11/2015 | Endo et al. | |
| 9,393,880 | B2 * | 7/2016 | Becker | H04L 12/40169 |
| 9,748,617 | B2 * | 8/2017 | Nakaya | H01M 10/482 |
| 10,091,161 | B2 * | 10/2018 | Dubey | H04L 45/42 |
| 10,120,034 | B2 * | 11/2018 | Hanking | H01M 10/482 |
| 2004/0027094 | A1 | 2/2004 | Sanders et al. | |
| 2009/0257440 | A1 | 10/2009 | Yan et al. | |
| 2013/0026979 | A1 | 1/2013 | Endo et al. | |
| 2014/0229129 | A1 | 8/2014 | Campbell et al. | |
| 2017/0158131 | A1 | 6/2017 | Friebe | |
| 2020/0204396 | A1 | 6/2020 | Kobayashi | |

FOREIGN PATENT DOCUMENTS

| | | |
|---|---|---|
| JP | 2001511637 A | 8/2001 |
| JP | 2003174464 A | 6/2003 |
| JP | 2003195909 A | 7/2003 |
| JP | 2006007895 A | 1/2006 |
| JP | 2007124602 A | 5/2007 |
| JP | 2013031324 A | 2/2013 |
| JP | 2015074368 A | 4/2015 |
| JP | 2017515101 A | 6/2017 |
| JP | 2018195952 A | 12/2018 |
| JP | 2020501481 A | 1/2020 |
| WO | 2017189361 A1 | 11/2017 |
| WO | 2019009531 A1 | 1/2019 |

OTHER PUBLICATIONS

Supplementary Search Report dated May 26, 2023 in counterpart European Patent Appln. No. 20831626.5.
International Preliminary Report on Patentability dated Dec. 28, 2021 for counterpart PCT international application No. PCT/US2020/039120.
Written Opinion of the International Search Authority dated Oct. 8, 2020 for counterpart PCT international application No. PCT/US2020/039120.
International Search Report dated Oct. 8, 2020 for counterpart PCT international application No. PCT/US2020/039120.
Japanese Office Action dated May 21, 2024 in counterpart Japanese Patent Appln. No. 2021-576641.
Israel Office Action dated Jun. 19, 2024 in counterpart Israel Patent Appln. No. 289176.
Indian Office Action dated Feb. 8, 2024 in counterpart Indian Patent Appln. No. 202237003340.
Indonesia Office Action dated Aug. 16, 2024 in counterpart Indonesia Patent Appln. No. P00202200541.
China National Intellectual Property Administration (CNIPA) Office Action dated May 30, 2025 in counterpart Chinese Patent Application No. 2020800567720.

* cited by examiner

BATTERY COMMUNICATION AND CONTROL SYSTEMS AND METHODS

FIELD

The present disclosure relates generally to systems and methods for communicating with and controlling batteries and/or battery packs, in particular, selectively controlling or modifying the receiving, storing and/or outputting of electricity by one or more of the batteries.

BACKGROUND

Battery system architecture for static applications and for mobile applications, such as vehicles, may utilize a network having message traffic. However, depending on the application, such message traffic could become excessively large and, accordingly, difficult to effectively process.

Additionally, scaling of such battery systems for particular applications and/or energy demands could be result in additional difficulties.

Accordingly, battery systems which provide for more efficient communication on a network and which facilitate scaling/sizing of battery systems for a variety of applications and operational conditions/parameters would be desirable.

SUMMARY

It would be desirable to provide one or more systems and methods that address one or more of the issues discussed above, as well as other potential issues. Moreover, it would be beneficial to furnish battery systems and/or control systems which provide for more efficient communication on a network and which facilitate the scaling/sizing of battery systems used in a variety of applications.

Accordingly, apparatuses and methods are disclosed for battery systems and control systems substantially as shown in and/or described in connection with at least one of the figures, and as set forth more completely in the claims.

More specifically, examples of the present disclosure are generally directed to battery system control, networks, apparatuses, arrangements, and methods.

In one exemplary implementation disclosed herein, a system is provided for use with a battery having an electronic system connected to a battery network configured to generate a state variable associated with the receiving, storing and/or outputting of electricity by the battery. A router is connected to the battery network and the electronic system for monitoring the detectable state variable, and based on such monitoring, the receiving, storing and/or outputting of electricity by the battery is selectively modified and/or controlled. In another exemplary implementation disclosed herein, such system also may include a second network and a controller connected both to the second network and to the router via the battery network and being configured to monitor the router, and based on the monitoring of the router, selectively modifying the router and the receiving, storing and/or outputting of electricity by the battery.

Representative implementations disclosed herein include systems which improve the performance of a mobile application, which could include, without limitation, a mobile platform system ("MPS) with respect to the use of a battery and drive systems for motive force, off-board power or use of hydraulics, mechanical systems or other electronics in connection attachments or off-board tools or systems, or can be customized to vary among the foregoing options.

In an exemplary implementation disclosed herein, a system is provided for use with at least one battery communicatively connected to a battery network, the battery having an electronic system communicatively connected to the battery network, which is configured to generate at least one state variable associated with the receiving, storing and/or outputting of electricity by the battery, including, without limitation, voltage, current, temperature, impedance, frequency response of the battery, state of charge (integral of current), individual cell (voltage, current, temperatures), impedance from the inside of the pack to the outside or outside environment, (i.e., how well are the cells of the battery isolated from the outside environment), the state of safety switches inside of a battery pack (e.g., whether there is sufficient voltage available to close the relay), gas detection, fluid leak detection (e.g., liquid cooled leakage) and/or pressures and/or pressure transients systems, including batteries. The value of such states could determine a number of responses/action, including, without limitation, whether: to open a contactor, to disconnect one or more batteries or battery packs, to open or close a refrigerant valve or cooling valve, to open or close a heating circuit or heater, to perform cell balancing to keep all cells in a battery at about the same voltage and/or to adjust timing as to when to do such balancing. The system includes a router communicatively connected to the battery network and the electronic system and is configured to: (i) monitor the detectable state variable, and based on the monitoring of the detectable state variable, (ii) to selectively modify the receiving, storing and/or outputting of electricity by the battery.

A further representative implementation disclosed herein includes a system for use in connection with a mobile platform having at least one battery communicatively connected to a battery network, the battery having an electronic system communicatively connected to the battery network, which is configured to generate at least one state variable associated with the receiving, storing and/or outputting of electricity by the battery. The system has a router communicatively connected to the battery network and the electronic system and configured to: (i) monitor the detectable state variable, and based on the monitoring of the detectable state variable, (ii) to selectively modify at least one of the receiving, storing and/or outputting of electricity by the battery.

Another exemplary implementation disclosed herein includes a system provided for use with a plurality of batteries, each battery being communicatively connected to a battery network and having an electronic system communicatively connected to the battery network configured to generate at least one state variable associated with the receiving, storing and/or outputting of electricity by the battery. The system includes a router communicatively connected to the battery network and the electronic system and configured to: (i) monitor the detectable state variable in at least one battery of the plurality of batteries, and based on the monitoring of the detectable state variable, (ii) to selectively modify at least one of the receiving, storing and/or outputting of electricity by the battery.

In yet another exemplary implementation disclosed herein, a system is provided for use with at least one battery communicatively connected to a first network, the battery having an electronic system communicatively connected to the first network configured to generate at least one state variable associated with the receiving, storing and/or outputting of electricity by the battery. The system has at least one router communicatively connected to the first network and the electronic system and configured to: (i) monitor the detectable state variable of the least one battery, and based on the monitoring of the detectable state variable, to selectively modify at least one of the receiving, storing and/or outputting of electricity the battery.

A further representative implementation includes a second network also being provided, with a controller being connected to the second network and to the router via the first network, which is configured to: (a) monitor the router, and (b) based on the monitoring of the router, selectively modifying the router and/or the receiving, storing and/or outputting of electricity by the battery. Additionally, such implementation could include the router having a plurality of routers, each of the routers being communicatively connected to the first network and the electronic system, and each of the routers being programmed for communication with one another using a common message set.

An additional representative implementation disclosed herein includes a replacement battery, a replacement router, and the first network and the router being configured to allow selectively removal of the at least on battery or the router and corresponding replacement by the replacement battery or the replacement router without requiring modification to the first network, the battery, or the router. In another implementation, the first network and/or the second network of the system is selectively separable from the router to facilitate replacement and connection to the first network of the router with substantially no modification to the first network.

Another exemplary implementation disclosed herein includes a composite network comprised of an operational communication network sharing substantially the same physical medium with at least one of a diagnostic network and a programming network, or alternately, wherein the operational communication network does not share the same physical medium with the diagnostic network or programming network.

In still further exemplary implementation disclosed herein, a battery charging interface is communicatively connected to the battery, an electrical power interface is connected to the first network, and a thermal management component is associated with the battery, the router, the first network, and the second network, and the controller is configured to control the battery charging interface, the electrical power interface connected and/or the thermal management component.

In an additional representative implementation disclosed herein, the router is configured to assign to itself an identifier selected from a predetermined set of identifiers.

Another exemplary implementation disclosed herein includes at least one of the first network and the second network including a wiring harness, the wiring harness being configured to accept the router, and the router being configured to assign to itself an identifier based on the physical location of the router with respect to the wiring harness, or alternately, the wiring harness is configured to accommodate a plurality of components and to accept the router, and the router is configured to assign to itself an identifier with respect to at least one of the plurality of components. A further alternative includes the wiring harness having a plurality of parts to accept the router, and the router being configured to assign to itself an identifier with respect to at least one of the plurality of parts.

Another exemplary implementation disclosed herein includes the router, being configured such that while apart from the first network, the router assigns to itself an identifier to be used by the first network, assigns itself a wired location identifier to be used by the first network, assigns itself at least one of a GPS location, or assigns to itself a GPS offset location identifier to be used by the first network and/or assigns to itself a location identifier to be used by the first network based on wireless triangulation data.

A further representative implementation disclosed herein includes the at least one of the first network and the second network being configured to assign an identifier based on the presence of the router and the battery and/or to wirelessly assign an identifier based on the presence of at least one of the router and the battery.

Yet a still further exemplary implementation disclosed herein includes the first network and/or the second network including a wiring harness, the wiring harness being configured to accept the router, and at least one of the first network and the second network being configured to assign to itself an identifier based on the presence of the router with respect to the wiring harness.

And, a still further exemplary implementation disclosed herein includes at least one of the first network and the second network including a wiring harness not in communicative connection with the first network or the second network, the wiring harness being configured to accept the router, and at least one of the first network and the second network being configured to assign to itself an identifier based on the presence of the router with respect to the wiring harness.

In another exemplary implementation disclosed herein, a system is provided for use with a battery communicatively connected to a first network, the battery having an electronic system communicatively connected to the first network configured to generate at least one state variable associated with the receiving, storing and/or outputting of electricity by the battery, with the system including at least one router communicatively connected to the first network and the electronic system and configured to: (a) monitor the detectable state variable of the least one battery, and based on the monitoring of the detectable state variable; and (b) selectively modifying at least one of the receiving, storing and/or outputting of electricity the battery. A second network is provided as is also a controller connected to the second network and to the router via the first network and configured to (i) assign to at least one of the battery and the router an identifier representative of at least one of the battery and the router, (ii) monitor the router, and (iii) based on the identifier and monitoring of the router, selectively modify at least one of the router and the receiving, storing and/or outputting of electricity by the battery.

In another exemplary implementation disclosed herein, a system is provided for use with at least one battery communicatively connected to a first network, the battery having an electronic system communicatively connected to the first network configured to generate at least one state variable associated with the receiving, storing and/or outputting of electricity by the battery. The system includes at least one router communicatively connected to the first network and the electronic system and configured to: (a) assume an identifier representative of at least one of the battery and the router; (b) monitor the detectable state variable of the least one battery; and (c) based on the monitoring of the detectable state variable, selectively modify at least one of the receiving, storing and/or outputting of electricity the battery. Also included is a second network and a controller connected to the second network and to the router via the first network and configured to (i) monitor the router, and based on the identifier and monitoring of the router, (ii) to selectively modify at least one of the router and the receiving, storing, and/or outputting of electricity by the battery.

In additional implementations of the present disclosure, methods are provided and include a method for use with at least one battery having an electronic system communicatively connected to a battery network and configured to generate at least one state variable associated with the receiving, storing, and outputting of electricity by the battery. The method includes providing a router communicatively connected to the battery network and the electronic system, using the router to monitor at least one detectable state variable, and based on the monitoring of the at least one detectable state variable, selectively modifying at least one of the receiving, storing, and outputting of electricity by the battery. Further representative implementations include methods including providing a controller communicatively connected to a second network and to the router via the first network, monitoring the router using the controller, and based on the monitoring of the router, selectively modifying at least one of the router and the receiving, storing, and outputting of electricity by the at least one battery. The controller can also assign to the battery and/or to the router an identifier representative of at least one of the battery and the router and/or the router can assume an identifier representative of at least one of the battery and the router.

Another representative implementation disclosed herein includes a system for use with at least one battery communicatively connected to a first network, the battery having an electronic system communicatively connected to the first network configured to generate at least one state variable associated with the receiving, storing and/or outputting of electricity by the battery. The system includes at least one router communicatively connected to the first network and the electronic system and configured to: (a) assume a first identifier representative of at least one of the battery and the router; (b) monitor the detectable state variable of the least one battery; and (c) based on the monitoring of the detectable state variable, selectively modify at least one of the receiving, storing and/or outputting of electricity the battery. Further included are a second network and a controller connected to the second network and to the router via the first network and configured to: (i) assign a second identifier representative of at least one of the battery and the router, (ii) monitor the router, and based on monitoring of the router and at least one of the first identifier and the second identifier, (iii) to selectively modify at least one of the router and the receiving, storing, or outputting of electricity by the battery.

The features, functions, and advantages that have been discussed can be achieved independently in various examples or may be combined in yet other examples, further details of which can be seen with reference to the following description and drawings.

BRIEF DESCRIPTION OF THE DRAWINGS

Having thus described exemplary aspects of the disclosure in general terms, various features and attendant advantages of the disclosed concepts will become more fully appreciated as the same becomes better understood when considered in conjunction with the accompanying drawings, which are not necessarily drawn to scale, in which like reference characters designate the same or similar parts throughout the several views. The drawings form a part of the specification. Features shown in the drawings are meant as illustrative of some, but not all, embodiments of the present disclosure, unless otherwise explicitly indicated, and implications to the contrary are otherwise not to be made. Although in the drawings like reference numerals correspond to similar, though not necessarily identical, components and/or features, for the sake of brevity, reference numerals or features having a previously described function may not necessarily be described in connection with other drawings in which such components and/or features appear.

FIG. 2 is a schematic representation of an example of an implementation of an implementation of a battery communication and control system and method of the present disclosure having an energy management system of the present disclosure, including OEM messaging flow regarding system-level and battery-pack supplier level requests of energy access, requests for fault details, system-level/battery-pack level requests for no-energy access, battery pack status, fault details, and the like.

DETAILED DESCRIPTION

Examples of the present disclosure will now be described more fully hereinafter with reference to the accompanying drawings, in which some, but not all examples of the disclosure are shown. Indeed, various exemplary aspects of the disclosure may be embodied in many different forms and should not be construed as limited to the examples set forth herein. Rather, these examples are provided so that this disclosure will be thorough and complete and will fully convey the scope of the disclosure to those skilled in the art. Like reference numerals refer to like elements throughout.

Figure 1:
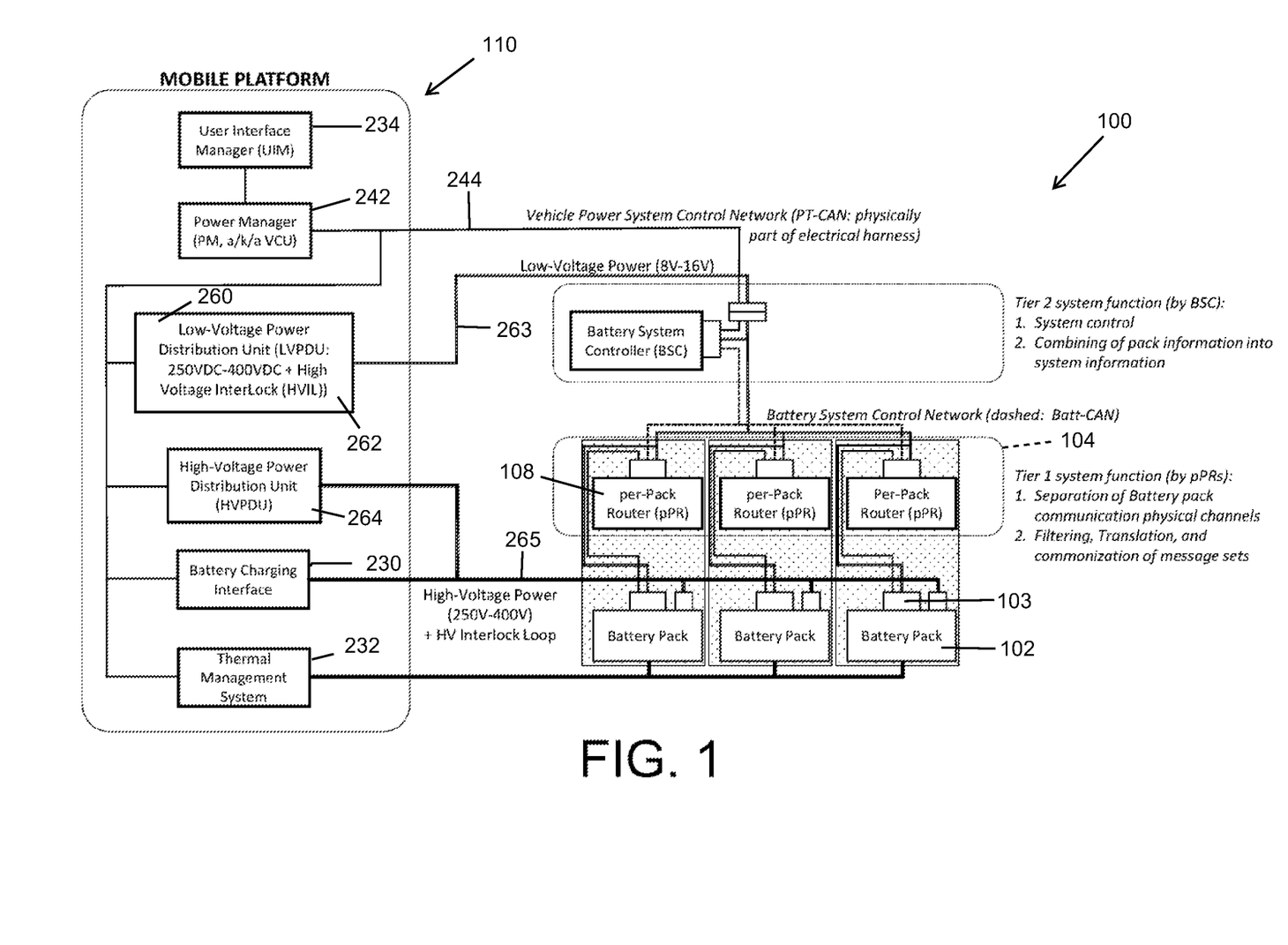
FIG. 1 is a schematic view of an example of an implementation of a battery communication and control system and method of the present disclosure, including a Tier 1 system function of per-pack routers having separation of battery pack communication physical channels and filtering, translation, and commonization of message sets, and a Tier 2 system function by a battery system control, which includes system control and the combining of battery pack information into system information.

Regarding the figures, generally, FIG. 1 is an overview of an exemplary implementation of a battery communication and control system and method of the present disclosure and includes a schematic of system functions, namely, a Tier 1 system function involving at least one router per battery pack, i.e., per-pack routers ("pPRs"), having separation of battery pack communication physical channels and filtering, translation, and commonization of message sets, and a Tier 2 system function by a BSC and including a system control and the combining of battery pack information into system information.

Figure 2:
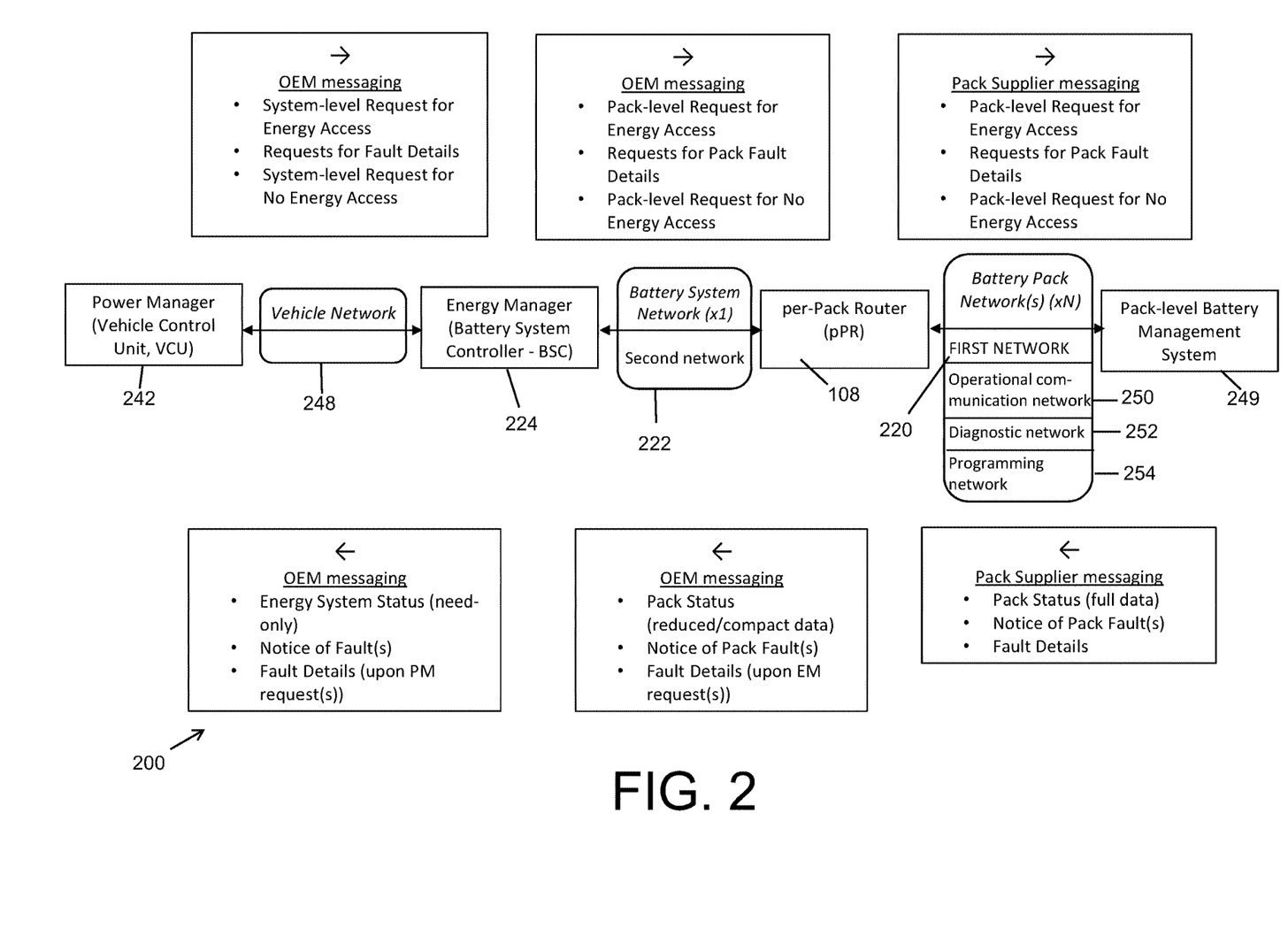

FIG. 2 depicts an exemplary implementation of an energy management system of the present disclosure, which includes energy management system roles and responsibilities for multi-battery pack system with mixed-compatibility battery management systems OEM messaging flow regarding system-level and battery-pack supplier level requests of energy access, requests for fault details, system-level/battery-pack level requests for no-energy access, battery pack status, fault details, and the like, which will be more fully understood in view of the description below.

Figure 3:
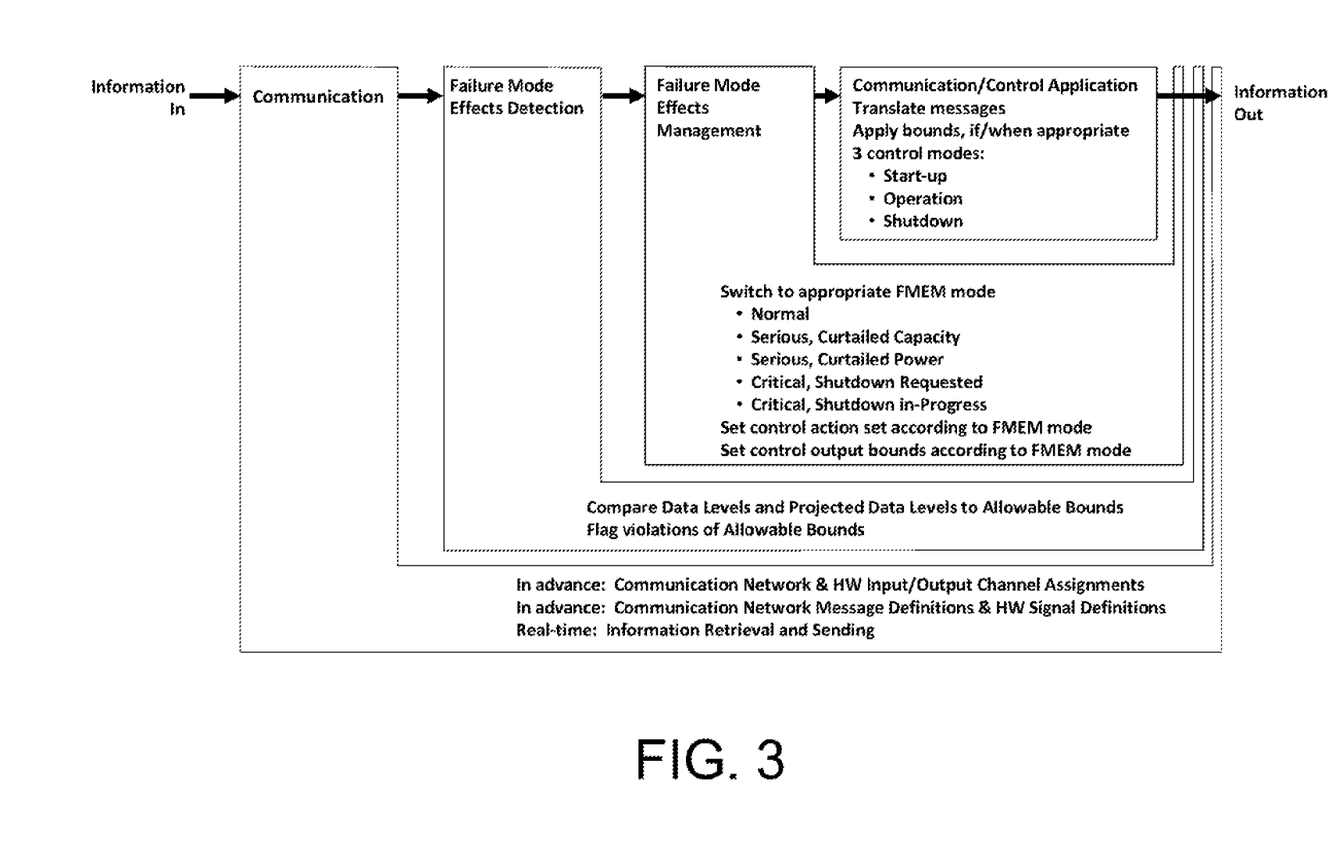
FIG. 3 is a schematic representation of an example of an implementation of an implementation of a battery communication and control system and method of the present disclosure having control functional layers and activity sequencing of the present disclosure, including the flow of information in, communication, failure mode effects detection and management, communication/control application, and information out.

FIG. 3 shows an exemplary implementation of control functional layers and activity sequencing of the present disclosure, including the flow of information in, communication (in advance (communication network and hardwire input/output channel assignments); in advance (communication network message definitions and hardwire signal definitions); and real-time (information retrieval and sending), failure mode effects detection and management (compare data levels and projected data levels to allowable bounds; and flag violations of allowable bounds), communication/control application (translate messages; apply bounds, if/when appropriate; and three control modes (start-up; operation; and shutdown), and information out. Turning to the figures more specially, FIGS. 1-3 illustrate an exemplary implementation of a multiple-pack battery system and method of communication and control therefor, and include illustration of a battery system that includes multiple battery packs ("multi-pack battery system" or "battery pack"). As shown in FIG. 1, the architecture, or system for two-tiered control of multiple battery packs, including an overall battery system controller ("BSC") and per-battery pack routers. Such architecture physically partitions functions of the battery pack, such as, but not limited to, an EnerDel (having an address of 8740 Hague Rd, Building 7, Indianapolis, IN 46256) pack and/or FEV (having an address of 4554 Glenmeade Lane, Auburn Hills, MI 48326-1766) Gateway into two (2) physical and functional tiers: one tier for separation of battery pack communication and one tier for system control.

The first and second tiers can be connected by a common controller area network ("CAN") communication bus. In an exemplary implementation, the functions of separation of battery pack communication may be achieved through the inclusion and use of a router per battery pack 102 ("per-Pack Router" or "pPR"), each of which routers may have two communication ports for use in routing and filtering/translation of communications.

In execution of its routing function, each pPR assumes for one of its communication ports a unique node identity on a communication bus shared with the BSC and the other pPRs. Each pPR also assumes, through its other communication port, all communication tasks for directly-connected control of the battery pack to which it is connected. This arrangement allows the use of battery packs in a system of multiple packs regardless of whether a battery pack itself has the feature of reprogrammability to assume a compatibly unique node ID on the shared CAN bus.

In execution of its filtering/translation function, each pPR filters the information from its battery pack and translates that content into a message set whose composition/definition is common across all pPRs and which is preferably of the minimum number and size of messages necessary for control of each single battery pack and reporting on the status of each single battery pack. The reduction of number and size of message sets reduces the message-handling capability of a BSC. The translation of information into a common message set reduces or eliminates the need for translation functions within the BSC and thus reduces data processing capability requirements. While a BSC with data processing capability to handle all filtering and translation could potentially be implemented, distribution of these tasks facilitates the computational functionalities in a fashion inherently scalable with the number of battery packs in the battery system.

More specifically, FIGS. 1 and 2 illustrate exemplary implementations of a system (or systems), generally 100, for use with at least one battery, which could be part of a battery pack (the battery and battery pack being designated by reference character 102), communicatively connected to a battery network, generally 104. Battery 102 includes an electronic system 103 communicatively connected to the battery network 104 configured to generate at least one state variable associated with the receiving, storing and/or outputting of electricity by the battery. System 100 includes a router, generally 108, communicatively connected to the battery network 104 and the electronic system and is configured to (i) monitor the detectable state variable, and (ii) based on the monitoring of the detectable state variable, selectively modify at least one of the receiving, storing and/or outputting of electricity by battery 102. System 100 may also be used in connection with a mobile platform system ("MPS"), generally 110. Further, system 100 may include a plurality of batteries and/or battery packs 102 (FIG. 1), with each battery being communicatively connected to the battery system controller area network ("Batt-CAN"), generally 104.

As shown in FIG. 2, system 100 has an energy management system, generally 200, with one or more batteries or battery packs 102 communicatively connected to a first network, or battery pack network, generally 220, battery 102 having an electronic system 103 communicatively connected to the first network 220 configured to generate at least one state variable associated with the receiving, storing and/or outputting of electricity by battery 102. System 200 has at least one router 108 communicatively connected to the first network 220 and the electronic system 103 and is configured to (i) monitor the detectable state variable of battery 102, and (ii) based on the monitoring of the detectable state variable, selectively modify at least one of the receiving, storing and/or outputting of electricity by battery 102.

A second network, or battery system network, generally 222, is also provided, and a controller, such as a battery system controller, or energy manager, generally 224, is connected to second network 222 and to router 108 via first network 220 and is configured to (i) monitor the router 108, and (ii) based on the monitoring of the router, selectively modify at least one of the router and the receiving, storing and/or outputting of electricity by the battery 102. Additionally, such implementation could include the router having a plurality of routers (FIG. 1), each of the routers being communicatively connected to first network 220 and the electronic system 103, and each of the routers being programmed for communication with one another using a common message set.

System 200 may be configured with the ability to install a replacement battery and/or a replacement router without requiring modification to first network 220 or the replacement battery, or the router. In another implementation, first network 220 and/or the second network 222 is selectively separable from the router to facilitate replacement and connection to the first network of the router with substantially no modification to the first or second networks 220, 222.

Another exemplary implementation includes first network 220 having a composite network comprised of an operational communication network, generally 250, sharing substantially the same physical medium with at least one of a diagnostic network, generally 252, and a programming network, generally 254 or alternately, the operational communication network can be configured to not share the same physical medium with at least one of a diagnostic network and a programming network.

As shown in FIG. 1, system 100 and/or 200 could include a battery charging interface, generally 230, communicatively connected to the battery, an electrical power interface connected to the first network, and a thermal management system, generally 232, is associated with the of battery 102, the router 108, first network 220 and/or second network 222. In such example, controller 224 is configured to control the battery charging interface, the electrical power interface connected, and the thermal management system, or component 232.

Another exemplary implementation includes at least one of first network 220 and second network 222 including a wiring harness, the wiring harness being configured to accept router 108, and router 108 being configured to assign to itself an identifier based on the physical location of the router with respect to the wiring harness, or alternately, the wiring harness being configured to accommodate a plurality of components and to accept the router, and the router being configured to assign to itself an identifier with respect to at least one of the components. A further alternative includes the wiring harness having a plurality of parts and to accept the router, and the router being configured to assign to itself an identifier with respect to at least one of the plurality of parts.

Another exemplary implementation of system 100 and/or 200 includes the router, while apart from the first network, being configured to assign to itself an identifier to be used by the first network, to assign to itself a wired location identifier to be used by the first network, to assign to itself at least one of a GPS location and GPS offset location identifier to be used by the first network and/or to assign to a location identifier to be used by the first network based on wireless triangulation data.

A still further exemplary implementation of system 100 and/or 200 includes the at least one of the first network and the second network being configured to assign an identifier based on the presence of at least one of the router and the battery and/or to wirelessly assign an identifier based on the presence of at least one of the router and the battery.

Yet another exemplary implementation of system 100 and/or 200 includes at least one of the first network and the second network including a wiring harness, the wiring harness being configured to accept the router, and at least one of the first network and the second network being configured to assign to itself an identifier based on the presence of the router with respect to the wiring harness. And, a further exemplary implementation includes at least one of the first network and the second network including a wiring harness not in communicative connection with the first network or the second network, the wiring harness being configured to accept the router, and at least one of the first network and the second network being configured to assign to itself an identifier based on the presence of the router with respect to the wiring harness.

An additional exemplary implementation of system 200 includes router 108 being configured to assign to itself an identifier selected from a predetermined set of identifiers.

Another exemplary implementation disclosed herein includes router 108 communicatively connected to first network 220 and the electronic system 103 and configured to (a) monitor the detectable state variable of the battery, and based on the monitoring of the detectable state variable, (b) selectively modifying the receiving, storing and/or outputting of electricity the battery. Controller 224 is configured to (i) assign to at least one of the battery and the router an identifier representative of at least one of the battery and the router, (ii) monitor the router, and based on the identifier and monitoring of the router, (iii) selectively modifying at least one of the router and the receiving, storing, and/or outputting of electricity by the battery. Alternately, a router 108 is communicatively connected to the first network and the electronic system and configured to (a) assume an identifier representative of at least one of the battery and the router, (b) monitor the detectable state variable of the least one battery, and (c) based on the monitoring of the detectable state variable, selectively modify at least one of the receiving, storing and/or outputting of electricity the battery. Also included is a second network and a controller connected to the second network and to the router via the first network and configured to (i) monitor the router, and (ii) based on the identifier and monitoring of the router, selectively modify at least one of the router and the receiving, storing, or outputting of electricity by the battery.

Yet another exemplary implementation disclosed herein includes system 200 having a router 108 communicatively connected to the first network 220 and the electronic system and configured to: (a) assume a first identifier representative of the battery and the router; (b) monitor the detectable state variable of the least one battery; and (c) based on the monitoring of the detectable state variable, to selectively modify at least one of the receiving, storing and/or outputting of electricity the battery. Further included are a battery system controller ("BSC"), or, controller, 224 connected to the second network 222 and to the router 108 via the first network 220 and configured to: (i) assign a second identifier representative of the battery and the router; (ii) monitor the router, and (iii) based on monitoring of the router and at least one of the first identifier and the second identifier, selectively modifying at least one of the router and the receiving, storing, or outputting of electricity by the battery.

Control of the battery systems are achieved through use of the BSC 224, having functions that fall into two functional sets, namely: (a) battery pack monitoring and control, which includes substantially all interactions between the BSC and a per-battery pack router ("pPR") with which BSC 224 communicates via a battery CAN ("Batt-CAN") 104 and (b) battery system functional request monitoring and status reporting, which includes substantially all interactions between the BSC and the vehicle control unit ("VCU"), or power manager, generally 242, to which the BSC is interfaced. A vehicle network, generally 248, is communicatively connected to the VCU 242 and BSC 224. The BSC is communicatively connected to the pPRs via the second network 222, and the first network 220 is communicatively to the pPRs and a pack-level battery management system, generally 249, and such communications are two-way.

The general relationship of the pPR to other battery system components is shown FIG. 2, which is a high-level block diagram of an example energy system control architecture and information flow, which could be used in connection with, for example, a mobile application, which could include, without limitation, a mobile platform system ("MPS") 110. System 100 includes, in one exemplary implementation, a battery pack status monitoring and control, wherein the pPR monitors and controls on sampled-data basis the battery pack to which it is interfaced using an interface arrangement in compliance with capabilities as supplied by the battery pack supplier.

In one exemplary implementation, system 100 includes a BSC that monitors and controls on a sampled-data basis the battery packs to which the BSC is interfaced via Batt-CAN and per-pack routers. Regarding inputs and monitoring and control, the BSC receives CAN battery pack status messages from the pPRs via the Batt-CAN. Control is accomplished by the BSC receiving requests, in the non-limiting exemplary implementation where systems 100, 200 are used in a vehicle, from VCU 242 via a single power train CAN ("PT-CAN"), generally 244, message for access or elimination of access to battery system high-voltage energy/power and for information about the battery system or specific battery packs. As to outputs and control thereof, the BSC issues supervisory requests for action via a single Batt-CAN message to each battery pack via its respective pPR. The pPRs are responsible for handling hardware enabled lines (apart from facility/vehicle key-ON) the handling of which is necessary to facilitate function of the battery pack. The BSC does not generally not have such responsibility. Also, in a non-limiting exemplary implementation, the BSC is generally not responsible for control of the hardware line or lines associated with key-ON, crash and/or service disconnect functions. An independent-path controller or controller arrangement would generally be responsible for the status of such features. The BSC sends supervisory messages via the Batt-CAN to the pPRs, and such messages will generally be in a single message format with bitmap codes identifying pertinent battery packs for connection and cooling.

The battery pack monitoring functions include the battery pack having operational states and projected operational states, which could include the BSC converting battery pack state information as reported by the battery packs via Batt-CAN into data suitable for BSC analysis and for transfer of such data. The BSC will determine if battery pack operational status are within calibratable bounds for allowable operation.

The BSC thus facilitates use of battery packs that do not have self-monitoring and also facilitates cross-checking for robustness of monitoring. The BSC determines whether the battery packs' operational status are projected to remain within calibratable bounds for allowable operation, and the BSC facilitates use of battery packs that do not have self-monitoring and also facilitates cross checking for the robustness of such monitoring. Further, the BSC determines which battery packs, if any, should receive cooling and/or cooling media. This inclusion of thermal management capability provided by the BSC allows the BSC to oversee and control battery packs regardless of whether the battery packs themselves have thermal management functionality For example, in one exemplary implementation, a battery pack should receive cooling media if the battery pack requests such via the Batt-CAN. Also, a battery pack should receive cooling media if the BSC determines from projection estimates that a cooling of the battery pack is necessary to keep the battery pack/battery module/battery cell temperatures within allowable bounds.

Battery pack monitoring offered by the BSC also includes failure mode detection and management. The BSC monitors the state of the battery packs, determines the severity of failures and/or faults, assigns corresponding coding, and determines the nature of handling such failures and/or faults and communication as appropriate. Severity classifications can be assigned in such situations by BSC 224, including corresponding codings, and failures/fault mode effective actions to be taken. These functions are often bundled into functions of VCU 242, which can perform other vehicle power system management functions, as well. For example purposes only, the failure mode detection management of the BSC could include a code, such as:

(a) "000" for designating that there is no failure/fault detected; the code "001" for indicating that a failure/fault is imminent or is not present at all, not serious, warning appropriate if failure/fault present, full-power operation may continue. No failure mode effect management ("FMEM") action(s) communicated from BSC to pPRs;

(b) "010" for a failure/fault has been detected, is serious, and a warning is necessary, and curtailed capacity reporting by one or more battery packs. FMEM action from the BSC issued to the vehicle: the adjustment of capacity and state of charge ("SOC") to reflect curtailed capacity. FMEM action from BSC to pertinent battery pack routers: request for opening of contactors of pertinent battery packs if the SOC of pertinent battery packs reach curtailment bounds;

(c) "011" for a failure/fault detected, serious, warning necessary, curtailed battery requested by one or more battery packs. FMEM action from the BSC to the vehicle: adjustment of battery system power and current limits to reflect curtailed power capability; progressive reduction of current limits, as appropriate, to achieve reduction of power draw to levels within curtailment bounds of pertinent battery packs. FMEM action from the BSC is made to pertinent PPRs and a request for opening of contactors of pertinent battery packs if request for vehicle reduction of power draw do not result in vehicle action within a calibratable allowance for reaction time;

(d) "100" for failure/fault detected, critical, warning necessary, shutdown requested—FMEM: the BSC sends to PT-CAN 244 a request for shutdown and sends the pPRs via battery network, or, Batt-CAN,104 requests to shut down according to normal shutdown sequence; and (e) "101" for a failure/fault detected, critical, warning necessary, shutdown in progress. In this case, the BSC sends to the pPRs via the Batt-CAN requests to shutdown, with prejudice and notify the vehicle that a shutdown is in progress.

Regarding the contactor closure discussed above, such contactor closure sequence information is provided by the BSC via the Batt-CAN. In the case of a contactor closure sequence, wherein the battery system is initially discharging, the BSC will determine, from information reported by the pPRs via the Batt-CAN, the sequencing order for pack-by-pack BSC requests for main contactor closure that will result in a closure sequence of descending order of open-circuit voltage, VOC, starting with the battery pack having the highest VOC, for startups leading to discharge operations of the battery system. In the event of a contactor closure sequence, wherein the battery is initially charging, the VOC will determine, from information reported by the pPRs via the Batt-CAN, the sequencing order for pack-by-pack BSC requests for main contactor closure that result in a closure sequence of ascending order of the open-circuit voltage VOC starting with the battery pack having the lowest VOC, for startups leading to charging of the battery system. In the event of per-battery pack effective series resistance, the BSC will identify, remember, and update from information reported by the pPRs via the Batt-CAN, an estimate of the effective series resistance in each battery pack.

In an exemplary implementation, BSC 224 exercises battery pack control, and will initiate startup and connection and disconnection and shutdown of battery packs by issuing requests for connection and/or disconnection via the Batt-CAN upon receipt of a PT-CAN request from the VCU for high voltage energy/power access or disablement of access. Such actions initiated by the BSC may include battery pack contactor closure, wherein when notified by the VCU via the PT-CAN that a startup is to facilitate operations that primarily discharge the battery system, the BSC will request main contactor closure of battery packs in a sequence of descending order of open circuit voltage VOC. This feature is a system-level control function whose inclusion in the VOC eliminates the need to have preventive measures in individual battery packs, many of which do not have such a function if their original design intent was to serve as the pack of a single-pack battery system. When notified by the VCU via the PT-CAN that a startup is to facilitate operations to charge the battery system, the BSC will request main contactor closure of battery packs in a sequence of ascending order of open circuit voltage VOC.

In an exemplary implementation, the BSC is involved in battery pack-internal contactor restriction from closure, wherein with the initial implementation, the BSC will refrain from requesting closure of main contactors of a battery pack until/unless the voltage of the high-voltage battery-side bus is within a battery pack supplier-approved range of the subject battery pack's VOC. Downstream implementation includes the BSC refraining from requesting closure of main contactors of a battery pack until it calculates from the high-voltage battery-side bus voltage and battery pack resistance information that closure of the subject pack will result in approximately-equal current draw from each connected battery pack. These features are system-level control functions whose inclusion in the VOC eliminates the need to have preventive measures in individual battery packs, many of which do not have such a function if their original design intent was to serve as the pack of a single-pack battery system.

In the event of a battery pack or pPR-induced termination or suspension of startup or other failure to close contactors, the BSC may cease its request to a subject battery pack to close its contactors, pause a calibratable period of time, and issue a new request to close, i.e., a "retry," while holding its state as reported to VCU 242. If the retry function is included, the BSC will include as a calibratable parameter the maximum number of retries the BSC will attempt. The default is, obviously, no retries. If a battery pack fails to close its contactors beyond the maximum number of retries, the BSC will refrain from further retries and will note the failure, reporting to the VCU as part of its status reporting, discussed below.

In an exemplary implementation, the BSC 224 accommodates battery pack operation and will execute control of the battery thermal management system. Inclusion of thermal management capability allows the BSC to oversee and control battery packs regardless of whether the battery packs themselves have thermal management functionality Cooling medium flow (which could be powered by a blower and/or pump), enablement is included with BSC control, such that if the battery thermal management system's blower and/or pump requires a hardwired enabling signal, the BSC will control such enabling line. Regarding cooling medium flow control, the BSC controls such flow, in open and/or closed loop fashion and in on/off and/or variable speed fashion, by issuing of CAN bus requests or by a pulse-width modulation ("PWM") control-level signal to achieve overall battery cooling system thermal power transfer performance. If the battery packs are being cooled by air, the BSC will control blower speed, and similarly if cooled by liquid coolant, the BSC controls pump speed. If the battery packs are to be cooled by refrigerant, or if cooling air or liquid coolant are to be chilled by refrigerant, the BSC will control the refrigerant compressor and condenser fan. If the Batt-CAN bus loads are sufficiently low, the BSC may convey battery thermal management commands via the Batt-CAN. If the battery cooling system sizing is insufficient for simultaneously full-flow cooling of all battery packs that the BSC determines need cooling, the BSC may sequence cooling medium flow to battery packs in a pattern that achieves sequential, or staggered, cooling of the battery packs.

For battery pack shutdowns/disconnection, the BSC sends shutdown requests to the pPRs via the Batt-CAN, in order to initiate battery pack shutdown or battery pack disconnect. In the event of shutdown on VCU/PM requests, the BSC sends to the pPRs requests for battery pack disconnections and shutdowns upon requests from the VCU via the PT-CAN for shutdown of high-voltage power. For shutdowns without VCU/PM requests, the BSC sends to the pPRs requests for battery pack disconnections and shutdowns regardless of VCU/PM requests, if the event the BSC determines that the nature of the battery system or component failure/fault mode warrants such action. Such nature of failure will correspond to a battery system failure reporting code of "011".

As to downstream implementation, battery stack balancing interruption or battery pack balancing involves periodically, during key-OFF of the vehicle (or other device or equipment), when battery packs are most likely to undertake stack balancing (and according to a calibratable first stack-balance-interruption period), the BSC requests connection of battery packs to the high-voltage battery-side bus to affect open voltage balancing across the battery packs, and the BSC collects stack balance information from the battery packs via their respective pPRs. After a calibratable second, battery pack-balancing period, BSC 224 will issue shutdown requests to the pPRs to reinitiate shutdown and balancing. This function may be executed without shutdown if the battery packs in the system can be commanded to perform stack balancing without shutdown and/or absence of communication. The BSC will continue the interruption and restart of shutdown until it determines that continued balancing will not result in open voltage drift of a magnitude that would preclude all battery packs closing their contactors upon the next key-ON and subsequent requests for high-voltage power access.

While the present disclosure is not limited to an MPS and could find application in numerous other mobile or stationary applications, in an exemplary implementation with respect to an MPS 110, and in regard to battery system functional request monitoring and status reporting, the BSC, on a sample data basis and via the PT-CAN, monitors requests from, and issues battery pack status updates, to VCU 242 to which it is interfaced using predetermined CAN messaging. Regarding inputs, the BSC monitors the PT-CAN 244 for requests via a single message on the PT-CAN bus from the VCU for vehicle power bus access to, or disconnection from, the battery pack high-voltage energy/power. For outputs and status reporting, the BSC issues via the PT-CAN periodic updates of the battery pack state, wherein such periodic BSC reports include information necessary for the VCU to perform relay of information to the vehicle's user interface manager ("UIM"), generally 234 The BSC sends the VCU via the PT-CAN information related to abnormal battery pack behavior (i.e., failures/faults) using a higher-than-usual-priority fault alert message, upon receipt or detection of a failure/fault. The BSC-to-VCU failure presence message includes a two-bit or three-bit severity indication field, whose coding correlates to that discussed above. Aside from the severity indication field, the BSC-to-VCU failure presence message may also include detailed coding to reflect the system and/or components within the battery packs and/or the natures of their failures.

An example MPS 110 could include a low-voltage power distribution unit (LVPDU, generally 260, having of approximately 250 VDC-400 VDC and a high voltage interlock (HVIL)), generally 262, connected to a low-voltage (approximately 8V-16V) power pathway 263 and a high-voltage power distribution unit (HVPDU), generally 264, connected to a high-voltage (approximately 250V-400V) high voltage interlock loop 265.

As to battery system functional request monitoring, the BSC monitors the PT-CAN for requests via that bus from the VCU for vehicle power bus access to, or disconnection from, the battery pack high-voltage energy/power. Specifically, battery system status reporting includes the BSC consolidating failure/fault messages issued by the battery packs via their respective pPRs, and the BSC reports to the VCU/PM via the PT-CAN regarding the consolidated state of the battery system, wherein the BSC reports the state of progress of startup and/or battery pack main contactors. In the event of startup termination by a battery pack, the BSC will "hold its state" as reported to the VCU and will continue to report that state to the VCU while attempting retries or requests for contactor disclosure as discussed above. Consequently, the BSC holds its state as reported to the VCU until successful start-up of all battery packs from which the BSC requests startup or, until the VCU requests disconnection, after which, the BSC effectively shuts down and await further VCU requests for connection.

Turning now in more detail to the per pack routers (pPRs), the pPR functions generally comprise two functional sets, namely: (a) battery pack status monitoring and control, which includes interactions between the pPR and the battery packs to which such pPR is interfaced; and (b) battery pack functional requests monitoring and status reporting, which includes interactions between the pPR and the BSC to which such pPR is interfaced. The general relationship of the pPR to the other battery system components is shown in FIG. 3, which includes the detailed interface relationships for the pPR and which are described below.

Regarding battery pack status monitoring and control, the pPRs monitoring control on a sampled-data basis the battery pack to which they are respectively interfaced using the interface arrangement in compliance with capabilities as supplied by the particular battery pack manufacturer. As to inputs, and monitoring and control, the pPR performs monitoring by receiving controller area network battery pack status messages from a battery pack via a dedicated CAN bus between the pPR and the battery pack, i.e., the Pack-CAN, i.e., first network 220. For control, the pPR receives requests from the BSC via the Batt-CAN for access or elimination of access to battery pack high-voltage energy/power and for information about the battery pack.

Regarding outputs and control, the pPR issues supervisory requests for action to the battery pack, and more specifically, the pPR issues requests for action to the battery pack via the Pack-CAN, and the pPR is responsible for handling hardware enable lines wherein the handling is necessary to facilitate function of the battery pack. Since different battery packs may interpret such lines differently, the battery pack-dependent configuration of the pPR would determine how the pPR will properly execute such handling. The pPR will generally not have responsibility for control of the hardware lines associated with "crash" and/or "service disconnect", because an independent-path controller or control arrangement, will typically be responsible for the status of such lines.

As to specific functions of the pPR, the pPR executes the initiation sequence to effect battery pack startup and operation upon receipt of Batt-CAN requests from the VOC. The pPR affects timing control of the issue of any/all CAN messaging and handling of any hardwire enable lines for the battery pack, other than those for the crash/service disconnect events. Note that proper battery pack startup includes termination of startup if the pPR, and its monitoring function, determines the need for such determination. The pPR monitors the state of the battery pack and determines the nature of the failure/fault mode handling and communication, and the pPR executes the initiation sequence to effect battery pack shutdown or battery pack disconnect when required Timing control of pPR messaging via battery pack CAN includes pPR silence on the battery pack CAN if such behavior is necessary for proper shutdown of a battery pack.

In an exemplary implementation, and in regard to battery pack functional request monitoring and status reporting, the pPRs, on a sample basis and via the Batt-CAN, monitor requests from and issue battery pack status updates to the BSC, to which such pPRs are interfaced using predefined CAN messaging. Regarding inputs, the pPR monitors the Batt-CAN for requests from the BSC for vehicle power bus access to, or disconnection from, the battery pack high-voltage energy/power, and with respect to outputs and status reporting, the pPR issues via the Batt-CAN periodic updates of the battery pack's state.

In another exemplary implementation and in regard to establishing identities with respect to the pPR and/or VOC, the pPR may be programmed to assume a specific Batt-CAN node identification ("ID"). Also, the pPR may claim an open Batt-CAN node ID and/or a Batt-CAN source address per SAE J1939 address claim practice if all other pPRs on the same Batt-CAN bus utilized similar identification practice. Further, the pPR may utilize a Batt-CAN electrical harness feature (e.g., the reading of the resistance value of the resister across terminals of the pPR's Batt-CAN harness connector) to determine a location-specific identity (Node ID or source address). The periodic pPR state report includes necessary information for the BSC to perform information relay to the vehicle power manager ("PM"), connection/disconnection sequencing control, and battery system thermal management oversight. The pPR sends to the BSC, via the Batt-CAN, information related to abnormal battery pack behavior (i.e., failures/faults) using a higher-than-usual-priority fault alert message upon receipt or detection of a failure/fault. The pPR-to-BSC failure sequence message may include a three-bit severity indication field using the coding nomenclature discussed above with regards to codes 000; 001; 010; 011; 100; 101, etc. Aside from the severity indication field, the pPR-to-BSC failure presence message may include detailed coding to reflect the system and/or components within the battery pack and the nature or natures of such failures.

In an exemplary implementation, and with respect to functions, the pPR reports on the state of battery pack startup and operation upon the Batt-CAN requests to connection from the BSC. The pPR also reports via the Batt-CAN the state of progress of startup and/or battery pack main contactors. In the event of startup termination, the pPR will "hold its state" and continue to report that state until the BSC requests disconnection, after which time the pPR will effect shutdown and await further BSC requests. Battery pack monitoring performed by the pPR includes the pPRs translation, from the battery OEM's message definitions to predefined message definitions, and the messages describing the state of the battery pack and any failure/fault modes in effect. The pPR translates, if necessary, the failure/fault messages issued by the battery pack via the Pack-CAN, and the pPR has the responsibility for detection and severity assessment of such failure/fault, or the imminence of such failure/fault, as may be gleaned from the battery pack state information not already included in the battery pack state variables as supplied by the battery pack supplier.

As noted above, exemplary implementations of the present disclosure, include pPRs programmed for communication on first network 220, with the same message set as other battery pack entities similarly connected to first network 220, and this correspondingly reduces translation duties of the BSC 224. Where first network 220 is a composite network comprised of an operational/run-time communication network and and/or programming network, which may or may not share the same physical medium, such as wiring, optical fiber, radio wave transmissions, Bluetooth, etc. The BSC that performs power management duties often allocated to platform-/vehicle-level controllers, such as a powertrain controller or VCU, i.e., these are additional duties not necessary concerning just with the battery packs, which are often done by other, dedicated systems or subsystems or entities. This facilitates packaging of a complete, essentially standalone multi-pack energy storage system, particularly in view of the BSC controlling battery charging interfaces, generally 230, electrical power export interfaces, and thermal management systems and/or components, such as fans, pumps, compressors, etc.

In exemplary implementations, the packaging of the pPR with battery pack forms a single overall, essentially "plug-&-play" package. Also, the BSC can be packaged separately from pPRs, so that physical addition or deletion of a pPR-battery pack combinations/pairs requires only addition or deletion of the pertinent pPR-battery pack, with no physical modification or rewiring of the BSC.

Exemplary representations of the present disclosure also include assignment/assumption of identifier features having the capability of pPR self-assignment of an identity based on available identifier within a set of identifiers, such as a predetermined range of identifiers. In some aspects, this could be interpreted to be an advancement over the SAE J1939 self-assignment of identifier and/or as related to IP node self-assignment of IP address in an IP system (wired or wireless), allowing world-wide access via internet or other network, whether terrestrial or extra-terrestrial.

Further representations include pPR self-assignment of an identifier based on physical location of the pPR, such as pPR self-assignment of one or more identifiers based on physical location on a network wiring harness (e.g., the pPR's harness/connector to Battery-CAN ("first network"), which provides the ability for a unique component in the pPR harness connector (e.g., to a Battery-CAN); e.g., resistor, and/or the ability for a unique code set by parts in the pPR harness connector (e.g., to aa Battery-CAN) e.g., a DIP switch set or solder bridge code setting. Self-assignment of the pPR of one or more identifiers is also realized based on a unique physical location of the pPR as determined by a location determination means not necessarily dependent on the network medium or network connector, and this may manifest using a wired location identifier other than a network medium connector; a GPS location or location offset (relative to a local reference for the battery system or any other system that has interest in knowledge of location of battery system components); and/or another location protocol (aside from GPS) wireless triangulation data.

Exemplary implementations also include the BSC being configured to assign identifiers based on knowledge of physical presence-in-location of a pPR and/or pPR-battery pack set, including the BSC being adapted for: detection of pPR presence and/or determination of pPR location based on network wiring harness feature; detection of pPR presence and/or determination of pPR location based on wiring harness feature not associated with network medium/media and/or detection of pPR presence; and/or determination of pPR location based on wireless communication system behavior.

Further implementations include the BSC being configured to have different levels of operations, e.g., "Emergency," "Maximum performance," "Maximum endurance," "Maximum safety," etc. In other words, such levels of operation specify how hard and rough the batteries 102 can be treated in any given environment or circumstance. Such operational level decision "could" be made, in the case of a vehicle fleet having systems 100 and or 200, by a fleet system operator in real time. Consequences could range from voiding warranty of the vehicle and/or other systems and components, to a dire emergency operational level leading to destruction of the battery system. (It should be noted that perhaps a software "key" would be required to prevent accidental activation of harmful operational commands). In sum, in certain "Emergency" situations, machines can be considered expendable as compared to human life. Decisions to operate equipment to a level of destruction could find particular us by governmental agencies, search and rescue operations, emergency responders, etc.

Exemplary methods are provided and include a method for use with at least one battery having an electronic system communicatively connected to a battery network and configured to generate at least one state variable associated with the receiving, storing, and outputting of electricity by the battery. The method includes providing a pPR communicatively connected to the battery network 220 and the electronic system, using the pPR to monitor at least one detectable state variable, and based on the monitoring of the at least one detectable state variable, selectively modifying at least one of the receiving, storing, and outputting of electricity by the battery.

Further illustrative implementations include methods wherein a controller is communicatively connected to a second network and to the router via the first network, and is used for monitoring the pPR. Based on the monitoring of the pPR, such method includes selectively modifying at least one of the pPR and the receiving, storing, and outputting of electricity by the at least one battery; the controller assigning to the battery and to the router an identifier representative of at least one of the battery and the pPR; and/or the pPR assuming an identifier representative of at least one of the battery and the pPR.

Although specific features of various examples of the invention may be shown in some drawings and not in others, this is for convenience only. In accordance with the principles of the invention, any feature of a drawing may be referenced and/or claimed in combination with any feature of any other drawing.

This written description uses examples to disclose various examples, which include the best mode, to enable any person skilled in the art to practice those examples, including making and using any devices or systems and performing any incorporated methods. The patentable scope is defined by the claims, and may include other examples that occur to those skilled in the art who may or may not choose to draw from Patent Cooperation Treaty (PCT) Application No. PCT/US19/35784, filed Jun. 6, 2019, of Dannar et al and counterpart U.S. Provisional Patent Application No. 62/682, 145, filed on Jun. 7, 2018, of Dannar, et al; U.S. Provisional Patent Application No. 62/696,194, filed Jul. 10, 2018; U.S. Pat. No. 7,603,207, of Abraham et al; U.S. Pat. No. 9,648, 808, of Force; U.S. Pat. No. 8,593,102, U.S. Patent No. of McGuire et al; U.S. Pat. No. 9,780,579, of Frankenberger; U.S. Pat. No. 5,521,588, of Kuehner et al; U.S. Pat. No. 6,061,617, of Berger, et al.; U.S. Pat. No. 8,602,153, of Osswald, et al; U.S. Pat. No. 7,230,819, of Muchow, et al; and Published Patent Application Publication No. US2014/285005, of Casteel; Published Patent Application Publication No. US2018/0057004, of Muldoon, et al; Published Patent Application Publication No. US2017/0174092, of Kohnke; Published Patent Application Publication No. US2009/0171482, of Mindeman; Published Patent Application Publication No. US2015/0045992, of Ashby; US2010/0206354, of Greene; White Paper 20 of Schneider Electric, The Different Types of AC Power Connectors in North America (Rev. 2), http://www.apc.com/salestools/SADE-5TNRML/SADE-5TNRML_R2_EN.pdf; and Precision AG Product products (http://www.wrightimp.com/Precision-Ag/Precision-Ag-Product.aspx) from Wright Implement, of Owensboro, Kentucky; ISO 11783, Tractors and Machinery for Agriculture and Forestry-Serial Control and Communications Data Network ("ISO Bus" or "ISOBUS"), a communication protocol for the agriculture industry based on the SAE J1939 protocol (which includes CAN bus), https://en.wikipedia.org/wiki/ISO_11783, the entirety of all of the foregoing being incorporated herein by reference.

Other embodiments of the current subject matter will be apparent to those skilled in the art from a consideration of this specification or practice of the subject matter disclosed herein. Thus, the foregoing specification is considered merely exemplary of the current subject matter with the true scope thereof being defined by the following claims.

What is claimed is:

1. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
   at least one router communicatively connected to the first network and the electronic system and configured to monitor at least one detectable state variable of the least one battery; and
   based on the monitoring of the at least one detectable state variable, selectively modify at least one of the receiving, storing, and outputting of electricity by the battery;
   a second network;
   at least one of the first network and the second network including a wiring harness;
   the wiring harness being configured to accept the at least one router;
   the at least one router being configured to assign to itself an identifier based on location of the at least one router with respect to the wiring harness;
   a controller connected to the second network and to the at least one router via the first network and configured to monitor the at least one router; and
   based on the monitoring of the at least one router, selectively modify at least one of the at least one router and the receiving, storing, and outputting of electricity by the at least one battery.

2. The system as defined in claim 1, wherein:
   the at least one router includes a plurality of routers, each being communicatively connected to the first network and the electronic system; and
   each of the plurality of routers being programmed for communication with one another and the electronic system of the at least one battery.

3. The system of claim 1, further comprising:
   a replacement battery;
   a replacement router; and
   the first network and the at least one router being configured to allow selective removal of the at least one battery or the at least one router and corresponding replacement by the replacement battery or the replacement router without requiring modification to the first network, the at least one battery, or the at least one router.

4. The system of claim 1, wherein the first network is selectively separable from the at least one router to facilitate replacement and connection of the at least one router to the first network with no modification to the first network.

5. The system of claim 1, wherein the second network is selectively separable from the at least one router to facilitate replacement and of the at least one router to the second network with no modification to the second network.

6. The system of claim 1, further comprising:
   the first network including a composite network comprised of an operational communication network with at least one of a diagnostic network and a programming network.

7. The system of claim 1, further comprising:
   the first network including a composite network comprised of an operational communication network separate from the at least one of a diagnostic network and a programming network.

8. The system of claim 1, further comprising:
   at least one of a battery charging interface communicatively connected to the at least one battery, an electrical power interface connected to the first network and a thermal management component associated with the at least one of the battery, the router, the first network, and the second network; and
   the controller being configured to control at least one of the battery charging interface, the electrical power interface connected, and the thermal management component.

9. The system of claim 1, further comprising the at least one router being configured to assign to itself an identifier selected from a predetermined set of identifiers.

10. The system of claim 1, further comprising:
    the wiring harness being configured to accommodate a plurality of components including the at least one router; and
    the at least one router being configured to assign to itself an identifier with respect to at least one of the plurality of components.

11. The system of claim 1, further comprising:
    the wiring harness including a plurality of parts and being configured to accept the at least one router; and
    the at least one router being configured to assign to itself an identifier with respect to at least one of the plurality of parts.

12. The system of claim 1, further comprising the at least one router, while apart from the first network, being configured to assign to itself an identifier to be used by the first network.

13. The system of claim 1, further comprising the at least one router, while apart from the first network, being configured to assign to itself a wired location identifier to be used by the first network.

14. The system of claim 1, further comprising the at least one router, while apart from the first network, being configured to assign to itself at least one of a GPS location and GPS offset location identifier to be used by the first network.

15. The system of claim 1, further comprising the at least one router, while apart from the first network, being configured to assign to a location identifier to be used by the first network based on wireless triangulation data.

16. The system of claim 1, further comprising at least one of the first network and the second network being configured to assign an identifier based on the presence of at least one of the at least one router and the at least one battery.

17. The system of claim 1, further comprising:
at least one of the first network and the second network including a wiring harness;
the wiring harness being configured to accept the at least one router; and
at least one of the first network and the second network being configured to assign to itself an identifier based on the presence of the at least one router with respect to the wiring harness.

18. The system of claim 1, further comprising:
at least one of the first network and the second network including a wiring harness not in communicative connection with the first network or the second network;
the wiring harness being configured to accept the at least one router; and
at least one of the first network and the second network being configured to assign to itself an identifier based on the presence of the at least one router with respect to the wiring harness.

19. The system of claim 1, further comprising at least one of the first network and the second network being configured to wirelessly assign an identifier based on the presence of at least one of the at least one router and the at least one battery.

20. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
at least one router communicatively connected to the first network and the electronic system and configured to:
monitor at least one detectable state variable of the least one battery; and
based on the monitoring of the at least one detectable state variable, selectively modify at least one of the receiving, storing, and outputting of electricity by the battery;
a second network;
at least one of the first network and the second network including a wiring harness;
the wiring harness being configured to accommodate a plurality of components including the at least one router;
the at least one router being configured to assign to itself an identifier with respect to at least one of the plurality of components;
a controller connected to the second network and to the at least one router via the first network and configured to:
monitor the at least one router; and
based on the monitoring of the at least one router, selectively modify at least one of the at least one router and the receiving, storing, and outputting of electricity by the at least one battery.

21. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
at least one router communicatively connected to the first network and the electronic system and configured to:
monitor at least one detectable state variable of the least one battery; and
based on the monitoring of the at least one detectable state variable, selectively modify at least one of the receiving, storing, and outputting of electricity by the battery;
a second network;
at least one of the first network and the second network including a wiring harness;
the wiring harness including a plurality of parts and being configured to accept the at least one router; and
the at least one router being configured to assign to itself an identifier with respect to at least one of the plurality of parts; and
a controller connected to the second network and to the at least one router via the first network and configured to:
monitor the at least one router; and
based on the monitoring of the at least one router, selectively modify at least one of the at least one router and the receiving, storing, and outputting of electricity by the at least one battery.

22. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
at least one router communicatively connected to the first network and the electronic system and configured to:
monitor at least one detectable state variable of the least one battery; and
based on the monitoring of the at least one detectable state variable, selectively modify at least one of the receiving, storing, and outputting of electricity by the battery;
the at least one router, while apart from the first network, being configured to assign to itself a wired location identifier to be used by the first network;
a second network; and
a controller connected to the second network and to the at least one router via the first network and configured to:
monitor the at least one router; and
based on the monitoring of the at least one router, selectively modify at least one of the at least one router and the receiving, storing, and outputting of electricity by the at least one battery.

23. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:

at least one router communicatively connected to the first network and the electronic system and configured to:
  monitor at least one detectable state variable of the least one battery; and
  based on the monitoring of the at least one detectable state variable, selectively modify at least one of the receiving, storing, and outputting of electricity by the battery;
a second network;
a controller connected to the second network and to the at least one router via the first network and configured to:
  monitor the at least one router; and
  based on the monitoring of the at least one router, selectively modify at least one of the at least one router and the receiving, storing, and outputting of electricity by the at least one battery;
at least one of the first network and the second network including a wiring harness;
the wiring harness being configured to accept the at least one router; and
at least one of the first network and the second network being configured to assign to itself an identifier based on the presence of the at least one router with respect to the wiring harness.

24. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
  at least one router communicatively connected to the first network and the electronic system and configured to:
    monitor at least one detectable state variable of the least one battery; and
    based on the monitoring of the at least one detectable state variable, selectively modify at least one of the receiving, storing, and outputting of electricity by the battery;
  a second network;
  a controller connected to the second network and to the at least one router via the first network and configured to:
    monitor the at least one router; and
    based on the monitoring of the at least one router, selectively modify at least one of the at least one router and the receiving, storing, and outputting of electricity by the at least one battery;
  at least one of the first network and the second network including a wiring harness not in communicative connection with the first network or the second network;
  the wiring harness being configured to accept the at least one router; and
  at least one of the first network and the second network being configured to assign to itself an identifier based on the presence of the at least one router with respect to the wiring harness.

25. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
  at least one router communicatively connected to the first network and the electronic system and configured to
    monitor at least one detectable state variable of the least one battery; and
    based on the monitoring of the at least one detectable state variable, selectively modify at least one of the receiving, storing, and outputting of electricity by the battery;
  a second network;
  at least one of the first network and the second network including a wiring harness;
  the wiring harness being configured to accept the at least one router; and
  the at least one router being configured to assign to itself an identifier based on the physical location of the at least one router with respect to the wiring harness;
  a controller connected to the second network and to the at least one router via the first network and configured to
    assign to at least one of the at least one battery and the at least one router an identifier representative of at least one of the at least one battery and the at least one router;
    monitor the at least one router; and
    based on the identifier and monitoring of the at least one router, selectively modify at least one of the at least one router and the receiving, storing, or outputting of electricity by the at least one battery.

26. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:
  at least one router communicatively connected to the first network and the electronic system and configured to
    assume an identifier representative of at least one of the at least one battery and the at least one router;
    monitor at least one detectable state variable of the least one battery; and
    based on the monitoring of the at least one detectable state variable, selectively modify at least one of the receiving, storing, and outputting of electricity by the battery;
  a second network;
  at least one of the first network and the second network including a wiring harness;
  the wiring harness being configured to accept the at least one router; and
    the at least one router being configured to assign to itself an identifier based on physical location of the at least one router with respect to the wiring harness;
  a controller connected to the second network and to the at least one router via the first network and configured to
    monitor the at least one router; and
    based on the identifier and monitoring of the at least one router, selectively modify at least one of the at least one router and the receiving, storing, or outputting of electricity by the at least one battery.

27. A system for use with at least one battery configured for receiving, storing, and outputting of electricity communicatively connected to a first network, the at least one battery having an electronic system communicatively connected to the first network configured to generate at least one state variable associated with the receiving, storing, and outputting of electricity by the battery, the system comprising:

at least one router communicatively connected to the first network and the electronic system and configured to
- assume a first identifier representative of at least one of the at least one battery and the at least one router;
- monitor at least one detectable state variable of the least one battery; and
- based on the monitoring of the at least one detectable state variable, selectively modify at least one of the receiving, storing, and outputting of electricity by the battery;

a second network;

at least one of the first network and the second network including a wiring harness;

the wiring harness being configured to accept the at least one router; and the at least one router being configured to assign to itself an identifier based on physical location of the at least one router with respect to the wiring harness;

a controller connected to the second network and to the at least one router via the first network and configured to
- assign a second identifier representative of at least one of the at least one battery and the at least one router;
- monitor the at least one router; and
- based on monitoring of the at least one router and at least one of the first identifier and the second identifier, selectively modify at least one of the at least one router and the receiving, storing, or outputting of electricity by the at least one battery.

* * * * *